United States Patent [19]

Frost et al.

[11] Patent Number: 5,250,949

[45] Date of Patent: Oct. 5, 1993

[54] SYSTEM AND METHOD FOR DATA COMPRESSION USING MULTIPLE CODEWORDS AND TRANSMITTED INDICES

[75] Inventors: Richard L. Frost; Christopher F. Barnes, both of Provo; Douglas M. Chabries, Salem; Richard W. Christiansen, American Fork, all of Utah

[73] Assignee: Brigham Young University, Provo, Utah

[21] Appl. No.: 392,905

[22] Filed: Aug. 14, 1989

[51] Int. Cl.$^5$ .............................................. H03M 1/00
[52] U.S. Cl. ...................................... 341/200; 341/899
[58] Field of Search ... 364/200 MS File, 900 MS File; 358/133, 135; 375/122; 341/200, 899; 395/500

[56] References Cited

U.S. PATENT DOCUMENTS

| | | | |
|---|---|---|---|
| 4,670,851 | 6/1987 | Murakami et al. | 364/518 |
| 4,906,991 | 3/1990 | Fiala et al. | 341/51 |
| 4,942,467 | 7/1990 | Waldman et al. | 358/135 |

*Primary Examiner*—Kevin A. Kriess
*Attorney, Agent, or Firm*—Thorpe, North & Western

[57] ABSTRACT

A multistage data compression system includes an encoder for receiving input data sequences from a data source, where the encoder comprises two or more quantizer stages, each stage having a memory for storing an established set of codewords preselected such that the sum of different combinations of codewords, one for each stage, is representative of likely to occur input data sequences. Each codeword of each stage has a respective index associated therewith. The encoder operates to select a codeword from at least two of the stages such that the sum of the selected codewords is a closer match to each input sequence than any other sum of codewords formed from the selected stages. When the codewords of interest are determined, the indices of those codewords are retrieved. These indices may then be transmitted to another location, stored in memory or otherwise processed. The system also includes a decoder coupled to the transmission channel, memory, or other mechanism which operates on the indices. The decoder includes a decoder memory for storing the established sets of codewords with respective indices, a retrieval device for retrieving from the decoder memory the codewords whose respective indices were transmitted, stored or otherwise processed, and a summing mechanism for adding the retrieved codewords to produce a reproduction data sequence representing an approximation of a corresponding input data sequence.

60 Claims, 4 Drawing Sheets

GLOSSARY

1. $P$ : DESIRED NUMBER OF VQ STAGES,
2. $p$ : STAGE INDEX WHERE $0 \le p \le P-1$,
3. $N^p$: DESIRED NUMBER OF CODE VECTORS OF $p^{th}$ STAGE, WHERE $N^p > 1$,
4. $N_c^p$: NUMBER OF CODE VECTORS THAT CURRENTLY EXIST AT THE $p^{th}$ STAGE,
5. $j^p$ : INDEX USED FOR THE CODE VECTORS OF THE $p^{th}$ STAGE,
6. $Y_{j^p}^p$ : $(j^p)^{th}$ CODE VECTOR OF THE $p^{th}$ STAGE,
7. $A_m^p = \{y_{j^p}^p ; 0 \le j^p \le N^p\}$ : CODE BOOK OF THE $p^{th}$ STAGE WHICH EXISTS AT THE $m^{th}$ ITERATION OF THE DESIGN ALGORITHM,
8. $N^e$ : DESIRED NUMBER OF EQUIVALENT CODE VECTORS,
9. $N_c^e$: NUMBER OF EQUIVALENT CODE VECTORS THAT CURRENTLY EXIST,
10. $j^e$ AND $k^e$ : INDEXES USED FOR THE EQUIVALENT CODE VECTORS,
11. $Y_{j^e}^c$ : $(j^e)^{th}$ CODE VECTOR OF THE EQUIVALENT QUANTIZER,
12. $A_m^e = \{Y_{j^e}^e ; 0 \le j^e \le N^e\}$ : EQUIVALENT CODE BOOK WHICH EXISTS AT THE $m^{th}$ ITERATION OF THE DESIGN ALGORITHM,
13. $S_{j^e}^e$ : $(j^e)^{th}$ PARTITION CELL OF THE EQUIVALENT QUANTIZER,
14. $P_V^e(A_m^e) = \{S_{j^e}^e ; 0 \le j^e \le N^e\}$ : VORONOI PARTITION WITH RESPECT TO THE EQUIVALENT CODE BOOK $A_m^e$,
15. $m$ : ITERATION COUNTER FOR JOINT ENCODER-DECODER OPTIMIZATION,
16. $n$ : ITERATION COUNTER FOR DECODER ONLY OPTIMIZATION,
17. $e$ : JOINT ENCODER-DECODER DISTORTION THRESHOLD LEVEL,
18. $e^d$ : DECODER ONLY DISTORTION THRESHOLD LEVEL,
19. $D_m$ : AVERAGE DISTORTION AFTER THE $m^{th}$ ITERATION OF JOINT ENCODER-DECODER OPTIMIZATION,
20. $D_n^d$ : AVERAGE DISTORTION AFTER THE $n^{th}$ ITERATION OF DECODER ONLY OPTIMIZATION,
21. $\{x_\ell^0 ; 1 \le \ell \le L\}$ : TRAINING SET OF L SAMPLES,
22. $\{X_\ell^P ; 1 \le \ell \le L\}$ : TOTAL RESIDUALS OF THE TRAINING SET,
23. $U_\ell^p$: THE GRAFT RESIDUAL OF THE $p^{th}$ STAGE FORMED FROM THE TRAINING SET VECTOR $X_\ell^0$ FOR $1 \le \ell \le L$,
24. $Y_{j^p}^c$ : CENTROID OF THE GRAFT RESIDUALS OF THE $(j^p)^{th}$ CODE VECTOR,
25. $L_{j^p}^c$ : SET OF INDEXES OF THE GRAFT RESIDUALS OF $Y_{j^p}^p$.

*Fig. 3*

SYSTEM AND METHOD FOR DATA COMPRESSION USING MULTIPLE CODEWORDS AND TRANSMITTED INDICES

BACKGROUND OF THE INVENTION

This invention relates to an improved method and apparatus for compressing data for storage, transmission or other processing, and more particularly to a method and apparatus for improving the accuracy of a multistage data compression arrangement while also reducing memory and computation requirements.

Data compression has been defined as the process of reducing the number of bits necessary to transmit or store information (see Makhoul, John, et al., "Vector Quantization in Speech Coding", Proc. of the IEEE, Vol. 73, No. 11, November 1985, pp. 1551-1568) or the conversion of a stream of very high rate sampled analog (continuous amplitude, discrete time) data into a stream of relatively low rate digital (discrete amplitude, discrete time) data for communication over a digital communication link or storage in a digital memory (Gray, Robert M., "Vector Quantization", IEEE ASSP Magazine, April, 1984, pp. 4-29). In other words, data compression involves the process reducing the amount of data needed to represent (for storage, transmission, etc.) information signals.

The need for new and more powerful methods of data compression continues to grow with the increase in the amount of information which users wish to transmit over or store in existing information transmission and storage facilities. Of course, in addition to seeking to reduce the amount of data necessary to transmit or store a given amount of information, users also desire to maintain the efficiency, security and reliability of the transmission and storage operation.

One approach to implementing data compression is known as vector quantization. Typically, in vector quantization an analog signal source is sampled to form a sequence of digital values representative of the analog signal. Portions or groups of the digital values are then represented as vectors, known as source vectors. The source vectors are compared to a set (codebook) of allowable vector patterns (code vectors) which have been previously determined to be statistically representative and stored. The code vectors all have assigned indices identifying them, and the index of the closest code vector to each source vector (the code vector that minimizes the distortion between it and the source vector) is either stored or transmitted to a receiver which also has a copy of the codebook. Such comparisons thus yield a small array of indices which identify a larger array of source vectors. This process of representing the array of source vectors with a smaller array of indices is vector quantization which, as is evident, achieves data compression.

The indices derived in quantization may be stored, transmitted to another location or otherwise operated upon, after which they are used to retrieve from memory the associated code vectors which represent approximations of the original source vectors. In effect, the retrieved code vectors carry the information (with some distortion) which was to be stored, transmitted or otherwise operated upon.

In one approach to determining the closest code vector, each source vector is compared with every code vector in the codebook. This approach, known as exhaustive search vector quantization (ESVQ), results in the computational and memory burden growing exponentially while the data rate remains constant and the vector length increases (the theory of data compression guarantees better performance with the use of longer vectors at a fixed compression ratio).

A modification of ESVQ, termed residual vector quantization or multistage vector quantization, has been proposed for reducing the memory and computation requirements of the vector quantization process. With multistage vector quantization, a series of quantization stages and codebooks are utilized to produce the array of indices for storage or transmission. Each stage of a multistage quantization system operates on an error or residual vector produced in the previous stage. Although this approach does reduce memory and computation costs, a decline in performance and accuracy of the quantization has also typically resulted. See for example the aforecited Makhoul, et al. reference, page 1576.

SUMMARY OF THE INVENTION

It is an object of the invention to provide a data compression method and apparatus which reduces the memory, computation, and hardware requirements without correspondingly reducing the performance and accuracy of the operations being carried out on the data.

It is a further object of the invention to provide such a method and apparatus which utilizes multistage vector quantization to achieve more reliable and accurate data compression and data reconstruction.

It is an additional object of the invention to provide a method and apparatus for constructing and searching codebooks used in a multistage vector quantization system.

It is also an object of the invention to provide such methods and apparatus which may be utilized with a wide range of source vector sizes and codebook sizes, and with varying numbers of stages.

The above and other objects of the invention are realized in a specific illustrative embodiment of a system and method for operating upon input data sequences. Included in this embodiment is an encoder for receiving each input sequence, with the encoder comprising two or more quantizer stages, each having a memory for storing an established set of codewords preselected such that the sum of different combinations of codewords, one from each stage, is representative of likely to occur input data sequences, each codeword of each stage having a respective index associated therewith. The encoder operates to select a codeword from at least two of the stages such that the sum of the selected codewords is a closer-match to each input sequence than any other sum of codewords formed from the selected stages, and to retrieve the selected codewords' indices. These indices may then be transmitted to another location, stored in memory or otherwise processed.

The illustrative embodiment also includes a decoder coupled to the transmission channel, memory, or other mechanism which operates upon the indices. This decoder, in turn, includes a decoder memory for storing the established set of codewords with respective indices, a retrieval device for retrieving from the decoder memory the codewords whose respective indices were transmitted, stored or otherwise processed, and a summing mechanism for adding the retrieved codewords to produce a reproduction data sequence representing an approximation of a corresponding input data sequence.

The established sets of codewords are determined by

1. Storing a training set of data sequences statistically representative of likely to occur input data sequences;
2. Storing current sets of codewords, one set for each stage of the encoder;
3. Forming equivalent codewords by adding together different combinations of one codeword from each current set, each equivalent codeword thus being comprised of the sum of a unique combination of constituent codewords;
4. Forming subsets of the training set of data sequences, one for each equivalent codeword, including in each subset those training set data sequences which match the associated equivalent codeword more closely than they do any other equivalent codeword;
5. Computing and storing a first distortion measure between the training set data sequences and their closest equivalent codewords;
6. Establishing the current sets of codewords as the established sets of codewords if the distortion measure is less than a predetermined threshold, and the number of stages and number of current codewords equal predetermined values, otherwise continuing to the next step;
7. Augmenting the current sets of codewords by storing new current codewords in existing sets of codewords in existing stages and in new sets of codewords in new stages, if the distortion measure is less than the predetermined threshold but the number of stages and number of codewords are less than the predetermined values, and returning to step 3, otherwise continuing to the next step;
8. For each stage, replacing the current set of codewords with a computed set of codewords, each computed set being formed for each current codeword of the corresponding stage by
   (a) selecting all equivalent codewords of which each current codeword is a constituent, each current codeword thus associating with a corresponding group of equivalent codewords and their associated subsets of training sequences,
   (b) subtracting from each training sequence of the associated subsets of each current codeword the difference of the associated subset's corresponding equivalent codeword and each current codeword to thereby form a set of residual training sequences,
   (c) averaging the set of residual training sequences to form a computed codeword,
   (d) replacing the current codeword by the computed codeword;
9. Forming new equivalent codewords from the computed codewords, and computing and storing a second distortion measure between the new equivalent codewords and the existing training sequences of the corresponding associated subsets; and
10. Returning to step 4 if the second distortion measure is less than a second predetermined threshold, otherwise repeating step 8.

With the sets of codewords thus obtained, an efficient and accurate data compression system, using multistage vector quantization, is obtained.

BRIEF DESCRIPTION OF THE DRAWINGS

The above and other objects, features and advantages of the invention will become apparent from a consideration of the following detailed description presented in connection with the accompanying drawings in which:

FIG. 3 is a glossary defining the terms and designations used in the FIGS. 2A and 2B flow charts.

DETAILED DESCRIPTION

Figure 1:
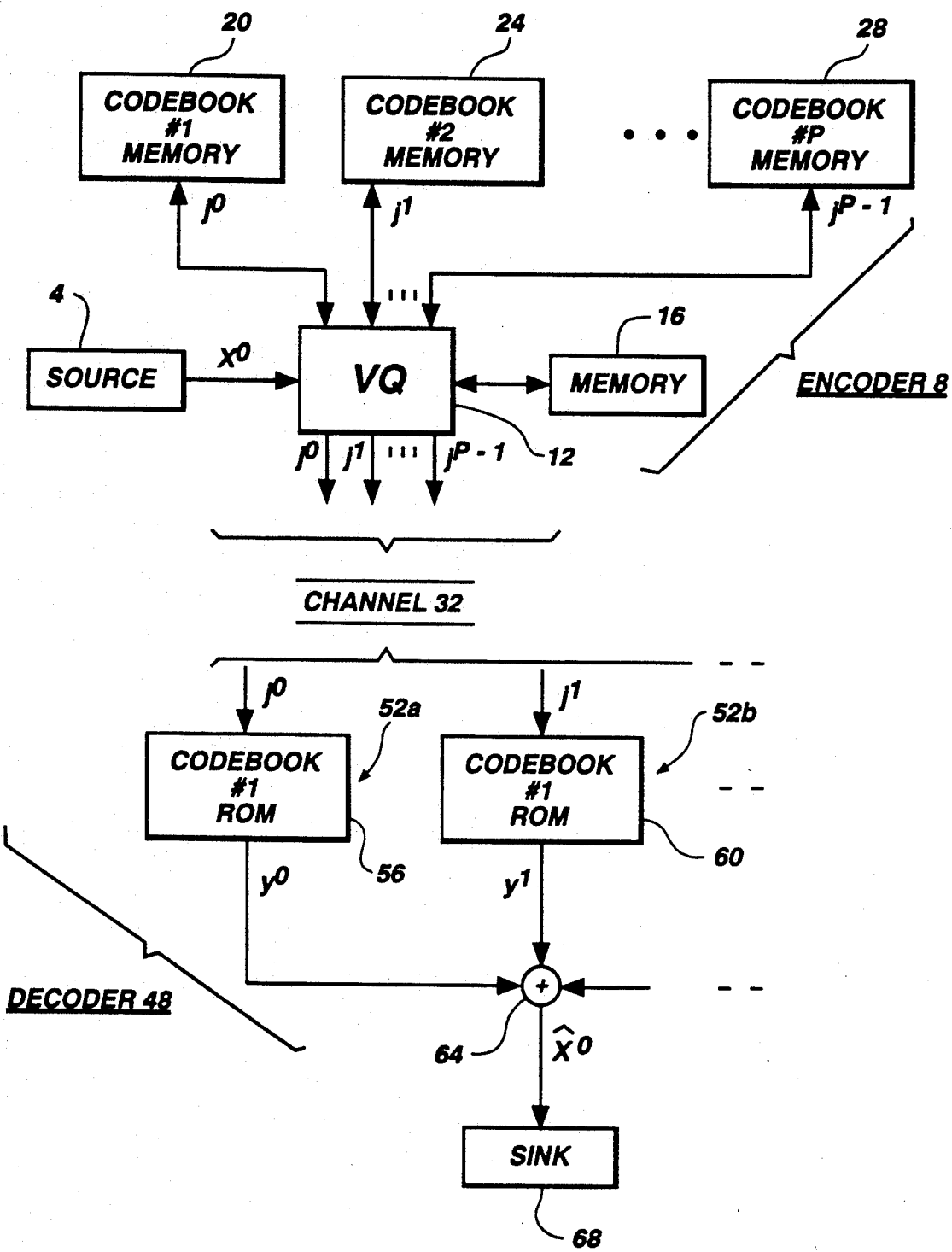
FIG. 1 shows an exemplary multistage vector quantization system made in accordance with the principles of the present invention.

Referring to FIG. 1, there is shown a multistage vector quantization system utilizing codebooks and code vectors or codewords constructed in accordance with the principles of the present invention. A source 4 produces a series of digital input data sequences or source vectors representing, for example, radar return signals, coded image signals, coded speech signals, and the like. The input data sequences are supplied to an encoder 8 which includes a microprocessor 12 (labeled VQ), and multiple vector quantization stages with code book memories 20, 24, etc. The microprocessor 12 forms equivalent codewords or code vectors from constituent codewords or code vectors retrieved from each of the memories 20, 24, etc., and stores the equivalent codewords in a memory 16. The equivalent codewords are formed by adding together the different combinations of one codeword from each of the codebook memories. The microprocessor 12 compares each source vector with each of the equivalent codewords and retrieves from the codebook memories indices identifying the constituent codewords of the equivalent codeword which most closely matches the said each source codeword.

All of the codewords stored in the memories 20, 24, etc. have corresponding identifying indices associated therewith, which indices are much shorter in length (fewer bits) than the codewords they identify.

The codeword indices retrieved by the microprocessor 12 are supplied to a channel 32 and transmitted to a decoder 48 which includes multiple stages 52a, 52b, etc. In particular, each index transmitted over the channel 32 is supplied to a corresponding codebook read only memory (ROM) such as ROM 56, ROM 60, etc. Stored in each ROM are the codewords stored in a corresponding codebook memory of the encoder 8. For example, the same codewords stored in codebook memory 24 are also stored in ROM 56, and the same codewords stored in codebook memory 44 are also stored in ROM 60, etc. Upon receipt of an index, a ROM supplies to a summing circuit 64 the codeword identified by the index. Thus, a number of codewords corresponding to the number of stages are supplied to the summing circuit 64 which simply adds the codewords together to produce a reproduction data sequence representing an approximation of a corresponding input data sequence. The reproduction data sequence is supplied to a sink 68 representing some type of utilization device.

The data compression, of course, occurs through the process of vector quantization and transmission of indices representing much longer codewords. That is, the input data sequences are "compressed" to the size of a composite of the indices transmitted for that data sequences.

Figure 2A:
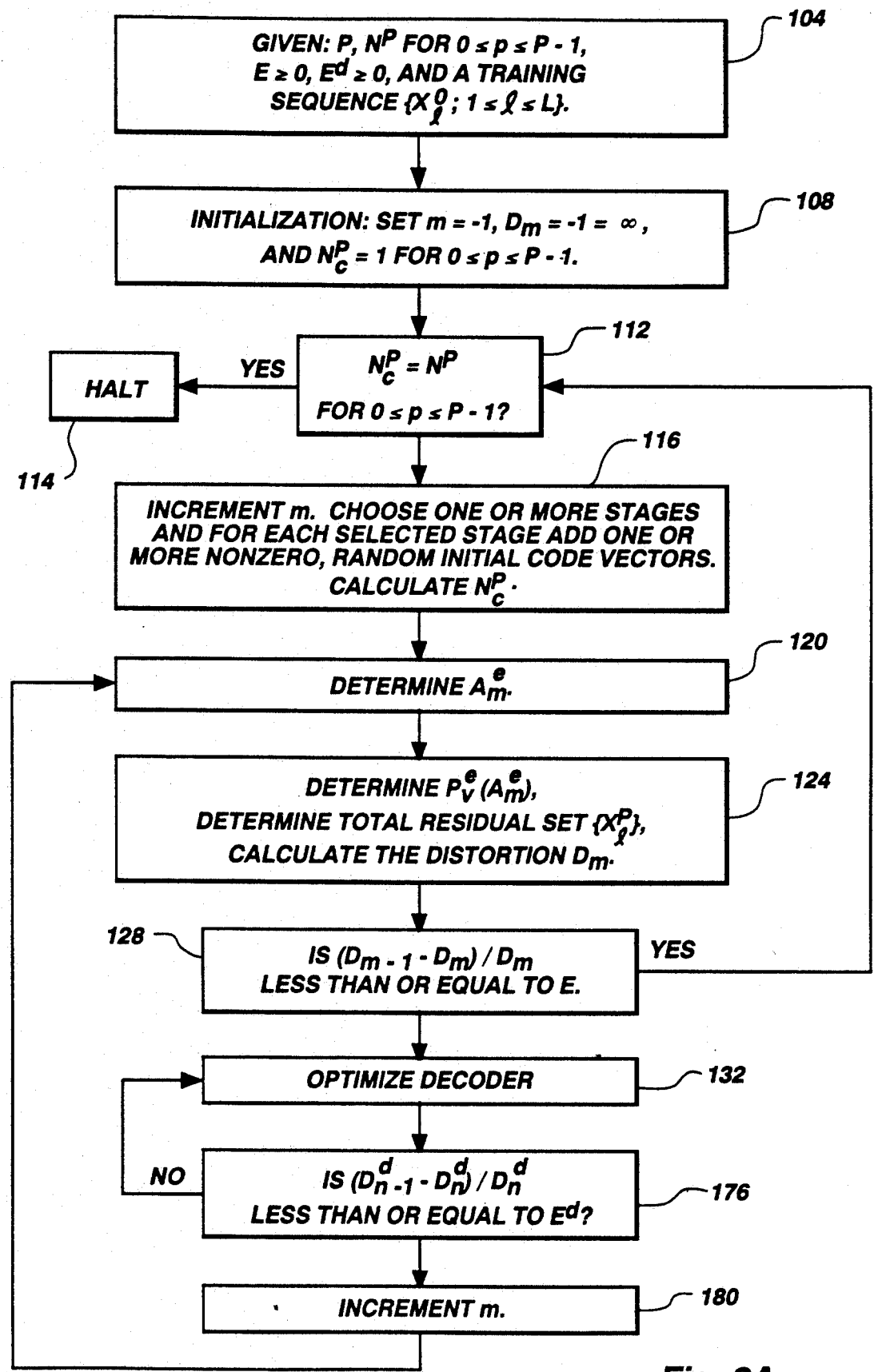
FIGS. 2A and 2B are flow diagrams illustrating the method of deriving codebooks for use with the present invention.
Figure 2B:
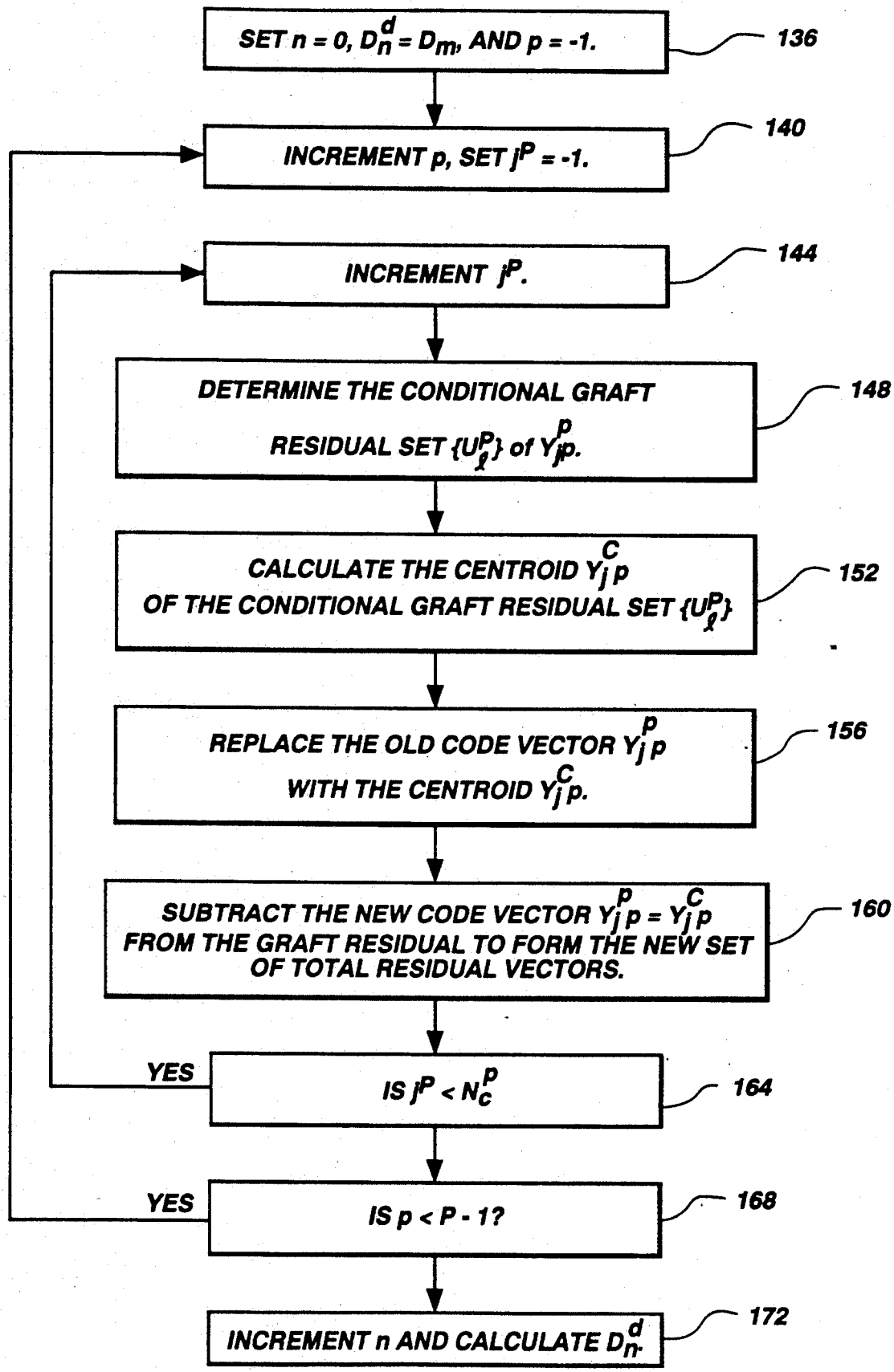

FIGS. 2A and 2B show a flow diagram of a process for determining the codewords or code vectors for the codebooks of a P-stage residual vector quantization system (such as in FIG. 1), where the ultimate desired number of code vectors for the pth stage is $N^p$, where $N^p > 1$ for $0 \leq p \leq P-1$, all in accordance with the present invention. FIG. 3 is a glossary of terms and symbols used in the flow diagram of FIGS. 2A and 2B. The criteria for whether the desired codebook code vectors have been constructed will be based upon E, a predetermined distortion threshold level for use in optimizing both the encoder and decoder, and Ed, a predetermined distortion threshold level for use in optimizing the decoder only. ("Distortion" is the variation between one signal and another; various distortion measures may be used in signal processing, probably the most commonly used being the mean-squared error distortion measure.) The number of desired stages may be dictated by the memory available for performing the vector quantization. For example, if less memory is available, then more stages with smaller codebooks may be used. The number of code vectors per stage (codebook size) is determined by the compression ratio desired—the smaller the codebook size, the greater will be the compression ratio and vice versa.

The first step in the codebook construction process is to select and store a source training set of data sequences $\{x_l^p; 1 \leq l \leq L\}$. (See box 104 of FIG. 2A.) The training set sequences or vectors are the most statistically likely to occur sequences of those produced by the source 4 (FIG. 1).

The next step is to initialize certain parameters of the system (box 108) by setting $m = -1$, where m is the iteration count for the process of joint optimization of the encoder and decoder, setting $D_m = -1 = \infty$, and $N_c^p = 1$, where $N_c^p$ represents the number of code vectors currently existing for the pth stage.

In a decision step 112 (FIG. 2A), a determination is made as to whether $N_c^p = N^p$. If it does, the process halts, if it does not (which would be the case in the first iteration), then the process moves to box 116. There, m is incremented and for one or more stages, one or more nonzero "seed" code vectors are added to the selected stages, i.e., stored in memory in sections corresponding to the stages. The code vectors added to the stages could be randomly selected or could be chosen from among the training set of vectors. With the present process, the desired code vectors for filling the codebooks will be determined regardless of the initial code vectors selected. With the "seed" vectors added to the stages, the number of code vectors $N_c^p$ that now exist for each stage is calculated. This number, of course, must not total more than the desired number of code vectors $N^p$. Next, the number of current equivalent code vectors $N_c^e$ is calculated as $$N_c^e = \prod_{p=0}^{p-1} N_c^p.$$

Equivalent code vectors are formed by adding together all combinations of one code vector from each stage (each codebook)—this yields $A_m^e = \{y_{je}^e; 0 \leq je \leq N^e\}$, (the equivalent codebook which exists at the mth iteration of the process), where $y_{je}^e$ is the (je)th equivalent code vector of the equivalent codebook (box 120 of FIG. 2A).

Then, subsets of the source training set of vectors previously selected and stored (box 104) are formed for each equivalent code vector, with each subset of an equivalent code vector containing those training set vectors which are closer to the subset's equivalent code vector than to any other equivalent code vector. This is shown in box 124 as "determine $P_y^e$ ($A_m^e$)" which equals $\{S_j^e; 0 \leq je \leq N^e\}$, the so-called Voronoi partition with respect to the equivalent codebook $A_m^e$, where $S_j^e$ is the $(j^e)^{th}$ partition cell or subset of the subdivided source training set of vectors.

During the partitioning of the training set of vectors, the distortion between the source training set of vectors of each subset and their closest equivalent code vector is calculated as the residual set $\{x_l^p: x_l^p = x_l^p - y_j^e e$ for $1 \leq l \leq L\}$. The average distortion is then calculated as $$Dm = (L)^{-1} \sum_{l=1}^{L} x_l^p,$$

(see box 124).

A decision is next made (box 128) as to whether the rate of change of the average distortion is less than or equal to E, i.e., whether $$\frac{D_{(m-1)} - Dm}{Dm} \leq E.$$

If it is, the process returns to box 112, where it is determined whether the desired number of code vectors have been developed. If so, the process halts, otherwise it continues to box 116. If, in box 128, the decision is "no", then the process moves to box 132 for decoder optimization. This begins in box 136 of FIG. 2B, where the following are initialized: set $n = 0$, $D_n^d = Dm$, and $p = -1$, where n is the iteration count for the process of decoder only optimization (FIG. 2B), $D_n^d$ is the average distortion after the $n^{th}$ iteration of the FIG. 2B process and Dm is the average distortion after the $m^{th}$ iteration of the FIG. 2A process.

Next increment p (iterate through each stage) and set $j^p = -1$ (box 140). Then increment $j^p$ (box 144) (iterate through the code vectors of each stage). Now determine the so-called conditional graft residual subset of $\{U_l^p\}$ of $y_j^p p$, defined as $\{U_l^p : U_l^p = x_l^p - (y_j^e e - y_j^p p) = x_l^p + y_j^p p$ if $x_l^p$ in $s_j^e e$ for any l in $\{1, 2, \ldots, L\}$ and $y_j^e e$ contains $y_j^p p$ as a constituent for any $j_e$ in $\{1, 2, \ldots, N^e\}$, with definitions of the various symbols given in FIG. 3. This step, performed in box 148, comprises selecting all equivalent code vectors of which each current code vector is a constituent (used to calculate the equivalent code vectors)—thus each current code vector is associated with a group of equivalent code vectors of which the code vector is a constituent, and each equivalent code vector, in turn, is associated with a subset of training set vectors which most closely match the equivalent code vector. The difference between an equivalent code vector and said each constituent current code vector is then subtracted from each training set vector of the subset associated with each current code vector, to thereby form a corresponding "graft" residual set.

The centroid $y_j^C p$ of the graft residual subset $\{U_l^p$ with l in Ljp} is then calculated (box 152), where Ljp is the set of training set vector indicies used to form the graft residual set of $Y_j^p p$. This centroid is the average of the graft residual set for each current code vector, and such current code vector is replaced with the corresponding centroid (box 156). The new code vector $y_j^p p = y_j^C p$ (the centroid of the graft residuals of the $(j^p)^{th}$ code vector) is then subtracted from its corresponding graft residual vectors $\{U_l^p\}$ to form a new set of total residual vectors $\{x_l^p : x_l^p = U_l^p - y_j^C p$ for all l in Ljp}.

If $j^p$ is less than $N^p$ (box 164), meaning that the last code vector of the stage has not yet been replaced, the process returns to box 144, otherwise the process moves to the next step (box 168). If p is less than P−1 (box 168), meaning that the last stage of current code vectors has not been replaced, then the process returns to box 140, otherwise the process moves to the next step. Here (box 172), n is incremented and the decoder distortion $D^d$ is calculated again. At this point, the process moves to box 176 of FIG. 2A.

At box 176, a determination is made as to whether $(D_{(n-1)}{}^d - D_n{}^d)/D_n$ is less than or equal to $E^d$. If not, p is set equal to −1 and the process returns to box 140 of FIG. 2B, otherwise the process moves to box 180.

Of course, the above-described process is repeated until optimum codebooks, according to the present invention, are obtained and the process is halted at box 114 of FIG. 2A. The process described above may be carried out on a Hewlett-Packard 350 Work Station.

The codebooks constructed using the present invention may be used with any multistage vector quantization system. Such codebooks enable improvement of performance and accuracy in carrying out data compression, and with a reduction in memory size.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements.

What is claimed is:

1. A data compression system for operating upon input data sequences comprising

A. an encoder for receiving each input sequence, said encoder including
        two or more quantizer stages, each having a memory for storing an established set of codewords preselected such that the sum of different combinations of codewords, one from each stage, is representative of likely to occur input data sequences, each codeword of each stage having a respective index associated therewith,
        means for selecting a codeword from at least two of the stages such that the sum of the selected codewords is a closer match to said each input sequence than any other sum of codewords formed from the selected stages,
        means for retrieving the selected codewords' indices,
        means for operating upon the retrieved indices, and
    B. a decoder coupled to the operating means, said decoder including
        a decoder memory for storing said established sets of codewords with respective indices,
        means for retrieving from the decoder memory the codewords whose respective indices are operated upon by the operating means,
        means for adding the retrieved codewords to produce a reproduction data sequence representing an approximation of the said each input data sequence, and
    c. wherein said established sets of codewords comprise codewords determined by
        (a) means for storing a training set of data sequences statistically representative of likely to occur input data sequences,
        (b) means for storing current sets of codewords, one set for each stage
        (c) means for forming equivalent codewords by adding together different combinations of one codeword from each current set, each equivalent codeword thus being comprised by the sum of a unique combination of constituent codewords,
        (d) means for forming subsets of the training set of data sequences, one for each equivalent codeword, including in each subset those training set data sequences which match the said each equivalent codeword more closely than any other equivalent codeword,
        (e) means for computing and storing a first distortion measure between the training set data sequences and their closest equivalent codewords,
        (f) means for establishing the current sets of codewords as the said established sets of codewords if the distortion measure is less than a predetermined threshold, otherwise continuing to next step,
        (g) means for, for each stage, replacing the current set of codewords with a computed set of codewords, each computed set being formed for each current codeword of the corresponding stage including
            means for selecting all equivalent codewords of which the said each current codeword is a constituent, said each current codeword thus associating with a corresponding group of equivalent codewords and their associated subsets of training sequences,
            means for subtracting from each training sequence of the said associated subsets of each current codeword the difference of the associated subsets' corresponding equivalent codeword and said each current codeword to thereby form a set of residual training sequences,
            means for averaging the said set of residual training sequences to form a computed codeword,
            means for replacing said each current codeword by said computed codeword,
        (h) means for forming new equivalent codewords from the computed codewords, and computing and storing a second distortion measure between the new equivalent codewords and the existing training sequences of the corresponding associated subsets, and operating
    the means for forming subsets of the training set of data sequences if the second distortion measure is less than a second predetermined threshold, otherwise operating the means for replacing the current set of codewords with a computed set of codewords.

2. A system as in claim 1 wherein said operating means is a storage device.

3. A system as in claim 1 wherein said operating means is a transmission medium.

4. A system as in claim 1 wherein the current sets of codewords are selected randomly.

5. A system as in claim 1 wherein the current sets of codewords are selected from among the training data sequences.

6. A system as in claim 1 wherein the means for storing current sets of codewords comprises means for storing one codeword in the memory of one stage, said one codeword comprising the average of the data sequences of the training set stored in the means for storing a training set of data sequences.

7. A system as in claim 6 wherein the means for storing current sets of codewords further comprises means for storing codewords in the memories of additional stages where such codewords are formed by averaging residual training sequences of subsets associated with equivalent codewords formed in connection with existing stages.

8. A system as in claim 7 wherein the means for storing current sets of codewords further comprises means for storing additional codewords in memories of existing stages by replacing one or more of the codewords in at least one of the memories of an existing stage where the replaced codewords are those having the greatest distortion of the codewords in the respective memory, and are each replaced by two or more additional codewords formed by arithmetically combining one or more of the components of said each replaced codeword with a preselected value.

9. A system as in claim 1 wherein the means for establishing the current sets of codewords as the said established sets of codewords if the distortion measure is less than a predetermined threshold comprises
   (j) means for establishing the current sets of codewords as the established sets of codewords if the distortion measure is less than a predetermined threshold and the number of stages and number of current codewords equal predetermined values, otherwise continuing to the next step;
   (k) means for augmenting the current sets of codewords by storing new current codewords in existing sets of codewords in existing stages and in new sets of codewords in new stages, if the distortion measure is less than the predetermined threshold and the number of stages and number of codewords are less than the predetermined values, and operating the means for forming equivalent codewords by adding together different combinations of one codeword from each current set, otherwise operating the means for forming subsets of the training set of data sequence.

10. A system as in claim 9 wherein the codewords comprises l components, each components including m bits, and wherein said predetermined values are selected such that the product of multiplying together the number of codewords in each stage is equal to k so that for a predetermined data compression ratio of (M bits in)-—to—(N bits out), the value $M = l \times m$ and the value $N = \log_2 k$.

11. A system as in claim 10 wherein the means for augmenting the current sets of codewords comprises means for augmenting a given existing set of codewords in an existing stage by a number of additional codewords which is a certain percentage of the existing codewords of the stage such that the sum of the existing codewords of the stage and the additional codewords yields a value less than or equal to said predetermined value for the number of current codewords.

12. A system as in claim 1 wherein said first distortion measure comprises a relative rate of change of computed distortion between the training set data sequences and their closest equivalent codewords, from one set of equivalent codewords to the next formed set of equivalent codewords.

13. A system as in claim 12 wherein said computed distortion comprises the sum of the squares of the differences between the equivalent codeword elements and the training set data sequence elements in the subset associated with the said each equivalent codeword.

14. A system as in claim 1 wherein said selecting means comprises means for comparing each input sequence with said equivalent codewords, and means for selecting the constituent codewords whose equivalent codeword most closely matches said each input sequence.

15. A system as in claim 14 wherein said encoder further includes means for computing said equivalent codewords upon receipt of each input sequence.

16. A system as in claim 14 wherein said encoder further includes means for storing said equivalent codewords for use in comparing with each input sequence.

17. A system as in claim 1 wherein said encoder further includes
   means for selecting certain subsets of codewords from each set of codewords of each stage,
   means for forming additional equivalent codewords whose constituents belong to said selected subsets,
   means for selecting the closest of the additional equivalent codewords to each input data sequence, and
   means for retrieving the indices of the constituent codewords of the selected additional equivalent codewords.

18. A system as in claim 17 wherein said certain subsets comprise codewords which are within a certain distance of each input data sequence.

19. A system as in claim 1 wherein said selecting means comprises
   means for selecting from a first one of the stages a first codeword which is a closer match to said each input sequence than any other codeword in the stage,
   means for subtracting the selected first codeword from said each input sequence to form a residual sequence,
   p-1 means, each for selecting from a corresponding one of the next p-1 stages a next codeword which is a closer match to said just previously formed residual sequence than any other codeword in said corresponding next stage, and
   p-2 means, each for subtracting a corresponding selected next codeword from the just previously formed residual sequence to form a next residual sequence.

20. A system as in claim 19 wherein the sequence of stages from which codewords are selected is ordered randomly.

21. A method for operating upon input data sequences to compress the data using an apparatus comprising (A) an encoder for receiving each input sequence, said encoder including: ($a_A$) two or more quantizer stages, each having a memory for storing an established set of codewords preselected such that the sum of different combinations of codewords, one from each stage, is representative of likely to occur input data sequences, each codeword of each stage having a respective index associated therewith, ($b_A$) means for selecting a codeword from at least two of the stages such that the sum of the selected codewords is a closer match to said each input sequence than any other sum of codewords formed from the selected stages, ($c_A$) means for retrieving the selected codewords' indices, ($d_A$) means for operating upon the retrieved indices, and (B) a decoder coupled to the operating means, said decoder including ($a_B$) a decoder memory for storing said established sets of codewords with respective indices, ($b_B$) means for retrieving from the decoder memory the codewords whose respective indices are operated upon by the operating means, ($c_B$) means for adding the retrieved codewords to produce a reproduction data sequence representing an approximation of the said each input data sequence, wherein the method comprises a method of establishing sets of codewords determined by (a) storing a training set of data sequences statistically representative of likely to occur input data sequences, (b) storing current sets of codewords, one set for each stage (c) forming equivalent codewords by adding together different combinations of one codeword from each current set, each equivalent codeword thus being comprised by the sum of a unique combination of constituent codewords, (d) forming subsets of the training set of data sequences, one for each equivalent codeword, including in each subset those training set data sequences which match the said each equivalent codeword more closely than any other equivalent codeword, (e) computing and storing a first distortion measure between the training set data sequences and their closest equivalent codewords, (f) establishing the current sets of codewords as the said established sets of codewords if the distortion measure is less than a predetermined threshold, otherwise continuing to next step, (g) for each stage, replacing the current set of codewords with a computed set of codewords, each computed set being formed for each current codeword of the corresponding stage by selecting all equivalent codewords of which the said each current codeword is a constituent, said each current codeword thus associating with a corresponding group of equivalent codewords and their associated subsets of training sequences, subtracting from each training sequence of the said associated subsets of each current codeword the difference of the associated subsets' corresponding equivalent codeword and said each current codeword to thereby form a set of residual training sequences, averaging the said set of residual training sequences to form a computed codeword, replacing said each current codeword by said computed codeword, (h) forming new equivalent codewords from the computed codewords, and computing and storing a second distortion measure between the new equivalent codewords and the existing training sequences of the corresponding associated subsets, and (i) returning to step (d) if the second distortion measure is less than a second predetermined threshold, otherwise repeating step (g).

22. A method as in claim 21 wherein said operating means is a storage device.

23. A method as in claim 21 wherein said operating means is a transmission medium.

24. A method as in claim 21 wherein the current sets of codewords are selected randomly.

25. A method as in claim 21 wherein the current sets of codewords are selected from among the training set data sequences.

26. A method as in claim 21 wherein step (b) comprises storing one codeword in the memory of one stage, said one codeword comprising the average of the data sequences of the training set stored in step (a).

27. A method as in claim 26 wherein step (b) further comprises the step of storing codewords in the memories of additional stages where such codewords are formed by averaging residual training sequences of subsets associated with equivalent codewords formed in connection with existing stages.

28. A method as in claim 27 wherein step (b) further comprises the step of storing additional codewords in memories of existing stages by replacing one or more of the codewords in at least one of the memories of an existing stage where the replaced codewords are those having the greatest distortion of the codewords in the respective memory, and are each replaced by two or more additional codewords formed by arithmetically combining one or more of the components of said each replaced codeword with a preselected value.

29. A method as in claim 21 wherein step (f) comprises the steps of (j) establishing the current sets of codewords as the established sets of codewords if the distortion measure is less than a predetermined threshold and the number of stages and number of current codewords equal predetermined values, otherwise continuing to the next step;

(k) augmenting the current sets of codewords by storing new current codewords in existing sets of codewords in existing stages and in new sets of codewords in new stages, if the distortion measure is less than the predetermined threshold and the number of stages and number of codewords are less than the predetermined values, and returning to step (c), otherwise continuing to the next step.

30. A method as in claim 29 wherein the codewords comprise l components, each component including m bits, and wherein said predetermined values are selected such that the product of multiplying together the number of codewords in each stage is equal to k so that for a predetermined data compression ratio of (M bits in)-—to—(N bits out), the value $M = l \times m$ and the value $N = \log_2 k$.

31. A method as in claim 30 wherein step (k) comprises the step of augmenting a given existing set of codewords in an existing stage by a number of additional codewords which is a certain percentage of the existing codewords of the stage such that the sum of the existing codewords of the stage and the additional codewords yields a value less than or equal to said predetermined value for the number of current codewords.

32. A method as in claim 21 wherein said first distortion measure comprises a relative rate of change of computed distortion between the training set data sequences and their closest equivalent codewords, from one set of equivalent codewords to the next formed set of equivalent codewords.

33. A method as in claim 32 wherein said computed distortion comprises the sum of the squares of the differences between the equivalent codeword elements and the training set data sequence elements in the subset associated with said each equivalent codeword.

34. A method as in claim 21 wherein said selecting means comprises means for comparing each input sequence with said equivalent codewords, and means for selecting the constituent codewords whose equivalent codeword more closely matches said each input sequence.

35. A method as in claim 34 wherein said encoder further includes means for computing said equivalent codewords upon receipt of each input sequence.

36. A method as in claim 34 wherein said encoder further includes means for storing said equivalent codewords for use in comparing with each input sequence.

37. A method as in claim 21 wherein said encoder further includes
    means for selecting certain subsets of codewords from each set of codewords of each stage,
    means for forming additional equivalent codewords whose constituents belong to said selected subsets,
    means for selecting the closest of the additional equivalent codewords to each input data sequence, and
    means for retrieving the indices of the constituent codewords of the selected additional equivalent codewords.

38. A method as in claim 37 wherein said certain subsets comprise codewords which are within a certain distance of each input data sequence.

39. A method as in claim 21 wherein said selecting means comprises
    means for selecting from a first one of the stages a first codeword which is a closer match to said each input sequence than any other codeword in the stage,
    means for subtracting the selected first codeword from said each input sequence to form a residual sequence,
    p-1 means, each for selecting from a corresponding one of the next p-1 stages a next codeword which is a closer match to said just previously formed residual sequence than any other codeword in said corresponding next stage, and
    p-2 means, each for subtracting a corresponding selected next codeword from the just previously formed residual sequence to form a next residual sequence.

40. A method as in claim 39 wherein the sequence of stages from which codewords are selected is ordered randomly.

41. A system for compressing input data sequences comprising
    A. an encoder for receiving each input sequence, said encoder including
        two or more quantizer stages, each having a memory for storing an established set of codewords preselected such that the sum of different combinations of codewords, one from each stage, is representative of likely to occur input data sequences, each codeword of each stage having a respective index associated therewith,
        means for selecting a codeword from at least two of the stages such that the sum of the selected codewords is a closer match to said each input sequence than any other sum of codewords formed from the selected stages,
        means for retrieving the selected codewords' indices,
        means for operating upon the retrieved indices, and
    B. a decoder coupled to the operating means, said decoder including
        a decoder memory for storing said established sets of codewords with respective indices,
        means for retrieving from the decoder memory the codewords whose respective indices are operated upon by the operating means,
        means for adding the retrieved codewords to produce a reproduction data sequence representing an approximation of the said each input data sequence, and
    C. wherein said established sets of codewords comprise codewords determined
        (a) storing a training set of data sequences statistically representative of likely to occur input data sequences,
        (b) storing current sets of codewords, one set for each stage
        (c) forming equivalent codewords by adding together different combinations of one codeword from each current set, each equivalent codeword thus being comprised by the sum of a unique combination of constituent codewords,
        (d) forming subsets of the training set of data sequences, one for each equivalent codeword, including in each subset those training set data sequences which match the said each equivalent codeword more closely than any other equivalent codeword,
        (e) computing and storing a first distortion measure between the training set data sequences and their closest equivalent codewords,
        (f) establishing the current sets of codewords as the said established sets of codewords if the distortion measure is less than a predetermined threshold, otherwise continuing to next step,
        (g) for each stage, replacing the current set of codewords with a computed set of codewords, each computed set being formed for each current codeword of the corresponding stage by
            selecting all equivalent codewords of which the said each current codeword is a constituent, said each current codeword thus associating with a corresponding group of equivalent codewords and their associated subsets of training sequences,
            subtracting from each training sequence of the said associated subsets of each current codeword the difference of the associated subsets' corresponding equivalent codeword and said each current codeword to thereby form a set of residual training sequences,
            averaging the said set of residual training sequences to form a computed codeword,
            replacing said each current codeword by said computed codeword,
        (h) forming new equivalent codewords from the computed codewords, and computing and storing a second distortion measure between the new equivalent codewords and the existing training sequences of the corresponding associated subsets, and
        (i) returning to step C.(d) if the second distortion measure is less than a second predetermined threshold, otherwise repeating step C.(g).

42. A system as in claim 41 wherein said operating means is a storage device.

43. A system as in claim 41 wherein said operating means is a transmission medium.

44. A system as in claim 41 wherein the current sets of codewords are selected randomly.

45. A system as in claim 41 wherein the current sets of codewords are selected from among the training set data sequences.

46. A system as in claim 41 wherein step C.(b) comprises the step of storing one codeword in the memory of one stage, said one codeword comprising the average of the data sequences of the training set stored in step C.(a).

47. A system as in claim 46 wherein step C.(b) further comprises the step of storing codewords in the memories of additional stages where such codewords are formed by averaging residual training sequences of subsets associated with equivalent codewords formed in connection with existing stages.

48. A system as in claim 47 wherein step C.(b) further comprises the step of storing additional codewords in memories of existing stages by replacing one or more of the codewords in at least one of the memories of an existing stage where the replaced codewords are those having the greatest distortion of the codewords in the respective memory, and are each replaced by two or more additional codewords formed by arithmetically combining one or more of the components of said each replaced codeword with a preselected value.

49. A system as in claim 41 wherein step C.(f) comprises the steps of
 (j) establishing the current sets of codewords as the established sets of codewords if the distortion measure is less than a predetermined threshold and the number of stages and number of current codewords equal predetermined values, otherwise continuing to the next step;
 (k) augmenting the current sets of codewords by storing new current codewords in existing sets of codewords in existing stages and in new sets of codewords in new stages, if the distortion measure is less than the predetermined threshold and the number of stages and number of codewords are less than the predetermined values, and returning to step C.(c), otherwise continuing to the next step.

50. A system as in claim 49 wherein the codewords comprise l components, each component including m bits, and wherein said predetermined values are selected such that the product of multiplying together the number of codewords in each stage is equal to k so that for a predetermined data compression ratio of (M bits in)--to--(N bits out), the value $M = l \times m$ and the value $N = \log_2 k$.

51. A system as in claim 50 wherein step (k) comprises the step of augmenting a given existing set of codewords in an existing stage by a number of additional codewords which is a certain percentage of the existing codewords of the stage such that the sum of the existing codewords of the stage and the additional codewords yields a value less than or equal to said predetermined value for the number of current codewords.

52. A system as in claim 51 wherein said first distortion measure comprises a relative rate of change of computed distortion between the training set data sequences and their closest equivalent codewords, from one set of equivalent codewords to the next formed set of equivalent codewords.

53. A system as in claim 52 wherein said computed distortion comprises the sum of the squares of the differences between the equivalent codeword elements and the training set data sequences elements in the subset associated with the said each equivalent codeword.

54. A system as in claim 41 wherein said selecting means comprises means for comparing each input sequence with said equivalent codewords, and means for selecting the constituent codewords whose equivalent codeword more closely matches said each input sequence.

55. A system as in claim 54 wherein said encoder further includes means for computing said equivalent codewords upon receipt of each input sequence.

56. A system as in claim 54 wherein said encoder further includes means for storing said equivalent codewords for use in comparing with each input sequence.

57. A system as in claim 41 wherein said encoder further includes
 means for selecting certain subsets of codewords from each set of codewords of each stage,
 means for forming additional equivalent codewords whose constituents belong to said selected subsets,
 means for selecting the closest of the additional equivalent codewords to each input data sequence, and
 means for retrieving the indices of the constituent codewords of the selected additional equivalent codewords.

58. A system as in claim 57 wherein said certain subsets comprise codewords which are within a certain distance of each input data sequence.

59. A system as in claim 41 wherein said selecting means comprises
 means for selecting from a first one of the stages a first codeword which is a closer match to said each input sequence than any other codeword in the stage,
 means for subtracting the selected first codeword from said each input sequence to form a residual sequence,
 p-1 means, each for selecting from a corresponding one of the next p-1 stages a next codeword which is a closer match to said just previously formed residual sequence than any other codeword in said corresponding next stage, and
 p-2 means, each for subtracting a corresponding selected next codeword from the just previously formed residual sequence to form a next residual sequence.

60. A system as in claim 59 wherein the sequence of stages from which codewords are selected is ordered randomly.

* * * * *